(12) United States Patent
Chen et al.

(10) Patent No.: US 12,394,473 B2
(45) Date of Patent: Aug. 19, 2025

(54) INTERFACE OF A MEMORY CIRCUIT

(71) Applicant: AP MEMORY TECHNOLOGY CORPORATION, Hsinchu County (TW)

(72) Inventors: Wenliang Chen, Hsinchu County (TW); Girish Nanjappa, Hsinchu County (TW); Lin Ma, Hsinchu County (TW); Hung-Piao Ma, Hsinchu County (TW); Keng Lone Wong, Hsinchu County (TW); Chun Yi Lin, Hsinchu County (TW)

(73) Assignee: AP MEMORY TECHNOLOGY CORPORATION, Hsinchu County (TW)

( * ) Notice: Subject to any disclaimer, the term of this patent is extended or adjusted under 35 U.S.C. 154(b) by 31 days.

(21) Appl. No.: 18/535,112

(22) Filed: Dec. 11, 2023

(65) Prior Publication Data

US 2024/0112727 A1    Apr. 4, 2024

Related U.S. Application Data

(63) Continuation of application No. 17/529,709, filed on Nov. 18, 2021, now Pat. No. 11,842,763.
(Continued)

(51) Int. Cl.
*G11C 11/4076* (2006.01)
*G09G 3/20* (2006.01)
(Continued)

(52) U.S. Cl.
CPC ........ *G11C 11/4093* (2013.01); *G09G 3/2096* (2013.01); *G09G 3/3208* (2013.01);
(Continued)

(58) Field of Classification Search
CPC ............ G11C 11/4093; G11C 11/4076; G11C 11/419; G11C 7/1054; G11C 7/1057;
(Continued)

(56) References Cited

U.S. PATENT DOCUMENTS 7,450,441 B2    11/2008  Lee
2002/0039324 A1*  4/2002  Lee ..................... G11C 7/1084
                                                             365/233.1
(Continued)

FOREIGN PATENT DOCUMENTS

CN           1770061 A      5/2006

OTHER PUBLICATIONS

Notice of Allowance issued by CNIPA dated May 9, 2025 for CN 2021113749348.
(Continued)

*Primary Examiner* — Khamdan N. Alrobaie
(74) *Attorney, Agent, or Firm* — WPAT, P.C.; Anthony King (57) ABSTRACT

An interface of a memory circuit includes a chip enable terminal, at least one data terminal, and a data strobe terminal. The chip enable terminal receives a chip enable signal that varies between a first high voltage and a low voltage. The at least one data terminal receives a first data signal that varies between a second high voltage and the low voltage during a command phase, and transmits or receives a second data signal during a data phase. The data strobe terminal receives a first data strobe signal that periodically varies between the second high voltage and the low voltage during the command phase, and transmits or receives a second data strobe signal that swings periodically during the data phase. During a transition interval between the com-
(Continued)

mand phase and the data phase, the data strobe terminal stops receiving or transmitting data strobe signals that swing periodically.

20 Claims, 8 Drawing Sheets

Related U.S. Application Data (60) Provisional application No. 63/118,621, filed on Nov. 25, 2020.

(51) Int. Cl.
*G09G 3/3208* (2016.01)
*G11C 11/4093* (2006.01)
*G11C 11/419* (2006.01)

(52) U.S. Cl.
CPC ........ *G11C 11/4076* (2013.01); *G11C 11/419* (2013.01); *G09G 2330/021* (2013.01); *G09G 2330/04* (2013.01)

(58) Field of Classification Search
CPC ..... G11C 7/106; G11C 7/1081; G11C 7/1084; G11C 7/1087
See application file for complete search history.

(56) References Cited

U.S. PATENT DOCUMENTS

2013/0063843 A1* 3/2013 Chen ................. H01L 23/49811
   361/56
2018/0061478 A1* 3/2018 Vergis ................. G11C 7/1045

OTHER PUBLICATIONS

Registration Notification issued with the NOA by CNIPA dated May 9, 2025 for CN 2021113749348.
Search report issued with the NOA by CNIPA dated May 9, 2025 for CN 2021113749348.
English translation the Search report issued by CNIPA dated May 9, 2025 for CN 2021113749348.

* cited by examiner

INTERFACE OF A MEMORY CIRCUIT

CROSS REFERENCE

This application claims the benefit of prior-filed provisional application No. 63/118,621, filed on Nov. 25, 2020, and non-provisional application Ser. No. 17/529,709, filed Nov. 18, 2021.

TECHNICAL FIELD

The present disclosure relates to an interface of a memory circuit, and more particularly, to an interface of a memory circuit capable of operating with signals of low voltage swing.

DISCUSSION OF THE BACKGROUND

A system on chip (SoC) can integrate most or all of components of a computer in one chip, and thus, can provide a high-efficiency solution with a small size. Due to the aforementioned advantages, the SoC has been adopted in a variety of applications, such as display driver integrated circuit (DDIC), microcontroller unit (MCU), Bluetooth True-wireless, and edge-AI.

To improve computation efficiency, a static random-access memory (SRAM) circuit is often embedded in the SoC. However, to integrate the SRAM into a same die as the SoC not only increases cost and complexity of the SoC, but also decreases yield rate of the die. Although an external dynamic random-access memory (DRAM) or a pseudo SRAM (PSRAM) may provide a more cost-effective solution, the high-speed, high-swing signals used for controlling the external DRAM or PSRAM cause significant power consumption and raise issues of electromagnetic interference (EMI).

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides an interface of a memory circuit. The interface comprises a chip enable terminal, at least one data terminal, and a data strobe terminal. The chip enable terminal receives a chip enable signal that varies between a first high voltage and a low voltage for enabling the memory circuit. The at least one data terminal receives at least one first data signal that varies between a second high voltage and the low voltage during a command phase, and transmits or receives at least one second data signal during a data phase. The data strobe terminal receives a first data strobe signal that periodically varies between the second high voltage and the low voltage during the command phase, and to transmits or receives a second data strobe signal that swings periodically during the data phase. During a transition interval between the command phase and the data phase, the data strobe terminal stops receiving or transmitting data strobe signals that swing periodically.

Another aspect of the present disclosure provides an interface of a memory circuit. The memory circuit includes at least one data terminal and a data strobe terminal. The at least one data terminal receives a first data signal during a command phase, and to transmits or receives a second data signal during a data phase. The data strobe terminal receives a first data strobe signal that swings periodically during the command phase, and transmits or receives a second data strobe signal that swings periodically during the data phase. The first data strobe signal is synchronized with the first data signal, and the first data strobe signal is arranged to latch and sample the first data signal. During a transition interval between the command phase and the data phase, the data strobe terminal stops receiving or transmitting data strobe signals that swing periodically.

Since the interfaces of the memory circuits provided by the embodiments of the present disclosure can be operated with the data strobe terminal stopping receiving or transmitting data strobe signals when no data is transmitting, the power consumption related to controlling an external memory can be significantly reduced and the corresponding EMI issue can be mitigated.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
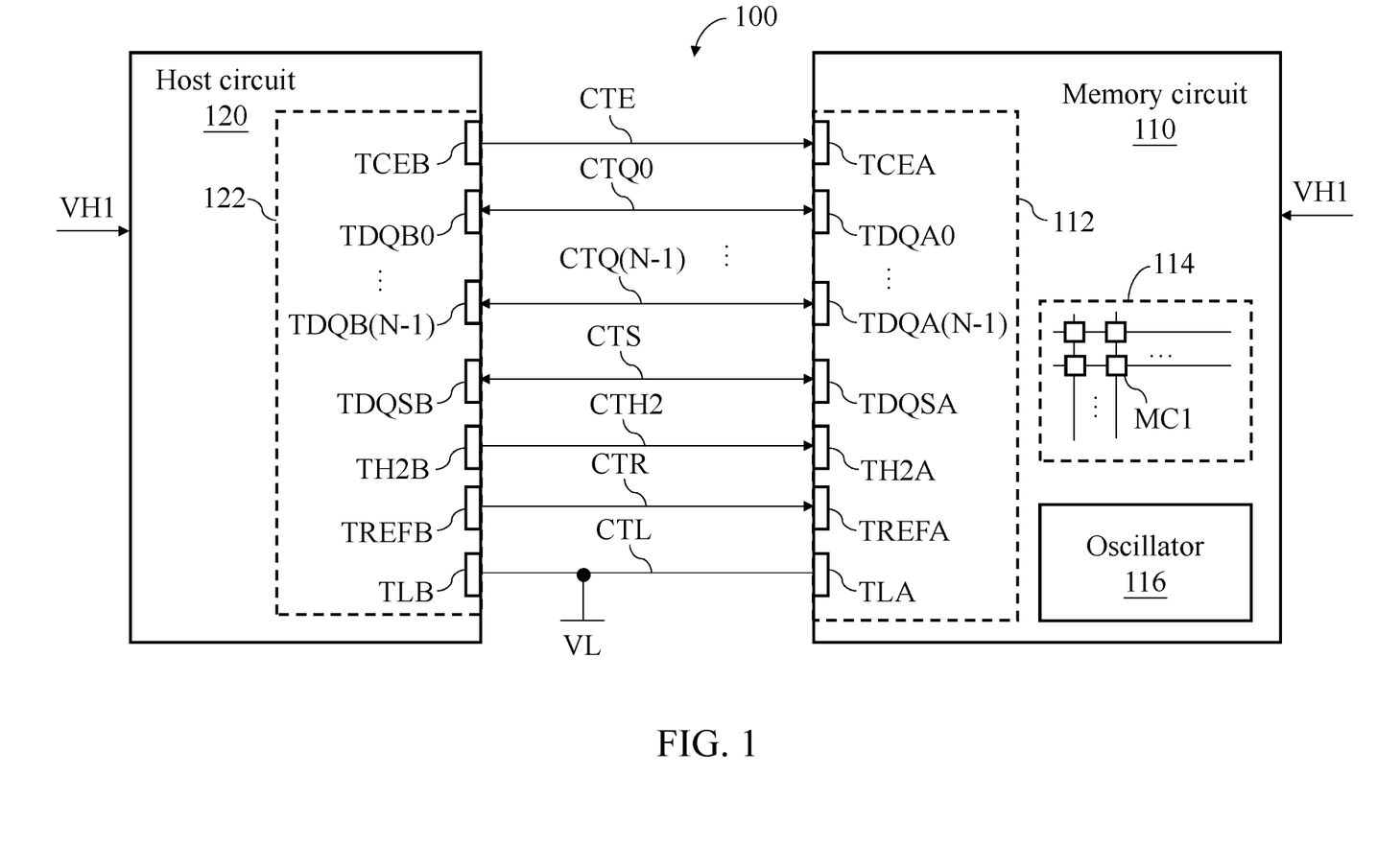
FIG. 1 shows a memory system according to one embodiment of the present disclosure.

FIG. 1 shows a memory system 100 according to one embodiment of the present disclosure. The memory system 100 comprises a memory circuit 110 and a host circuit 120. In some embodiments, the host circuit 120 may be designed as an SoC including a controller for handling the access of the memory circuit 110.

The memory circuit 110 may comprise a memory array 114 comprised of a plurality of memory cells, and the host circuit 120 may control the memory circuit 110 to access the memory space provided by the memory array 114. In some embodiments, the memory cells MC1 of the memory array 114 may be dynamic random access memory (DRAM) cells or static random access memory (SRAM) cells. Furthermore, in the present disclosure, the communication between the memory circuit 110 and the host circuit 120 may be performed with a novel mechanism by utilizing low voltage-swing signals without using constant oscillated clock signals; as a result, power consumption related to the access of the memory circuit 110 by the host circuit 120 can be effectively reduced.

As indicated in FIG. 1, the memory circuit 110 further comprises a first interface 112. The first interface 112 comprises a first chip enable terminal TCEA, N first data terminals TDQA0 to TDQA(N−1), and a first data strobe terminal TDQSA, where N is a positive integer. Correspondingly, the host circuit 120 may comprise a second interface 122. The second interface 122 also comprises a second chip enable terminal TCEB, N second data terminals TDQB0 to TDQB(N−1), and a second data strobe terminal TDQSB. Furthermore, the second chip enable terminal TCEB is coupled to the first chip enable terminal TCEA, the second data terminals TDQB0 to TDQB(N−1) are coupled to the first data terminals TDQA0 to TDQA(N−1), and second data strobe terminal TDQSB is coupled to the first data strobe terminal TDQSA. In the present embodiment, N is greater than 1, however, in some other embodiments, N may be 1. In such case, the first interface 112 has one first data terminal TDQA0, and the second interface 122 has one second data terminal TDQB0.

In some embodiments, the memory circuit 110 and the host circuit 120 may be formed in two different dies, and the memory system 100 may further comprise interconnects CTE, CTQ0 to CTQ(N−1), and CTS for coupling terminals of the memory circuit 110 and the host circuit 120 in different dies. The interconnect CTE may be coupled between the first chip enable terminal TCEA and the second chip enable terminal TCEB, the interconnect CTQ0 to CTQ(N−1) may be coupled between the first data terminals TDQA0 to TDQA(N−1) and the second data terminals TDQB0 to TDQB(N−1), and the interconnect CTS may be coupled between the first data strobe terminal TDQSA and the second data strobe terminal TDQSB. In some embodiments, the two dies of the memory circuit 110 and the host circuit 120 may be stacked in a 3D package, therefore the interconnects CTE, CTQ0 to CTQ(N−1), and CTS may be formed during the process of 3D packaging technology. The interconnects CTE, CTQ0 to CTQ(N−1), and CTS may be any kind of vertical die-to-die interconnect provided by the 3D packaging technology. For example, the interconnects CTE, CTQ0 to CTQ(N−1), and CTS may be wafer-to-wafer bonding pads, chip-to-wafer bonding pads, micro-bumps formed during the stacking from chip to wafer, micro-bumps formed during the stacking from chip to chip, etc. However, the present disclosure is not limited thereto. For example, in some other embodiments, the two dies of the memory circuit 110 and the host circuit 120 may be disposed laterally near to each other on a same substrate in a 2.5D package. In such case, the interconnects CTE, CTQ0 to CTQ(N−1), and CTS may comprise conductive traces formed in the substrate. Since the memory circuit 110 and the host circuit 120 may be formed in different dies by utilizing different suitable manufacturing processes, the yield rate of the memory system 100 may be improved.

Furthermore, in some embodiments, the memory system 100 may further comprise more memory circuits besides or adjacent to the memory circuit 110, and the host circuit 120 has to control all of the memory circuits in the memory system 100. In such case, the host circuit 120 may generate a chip enable signal to notify the corresponding memory circuit (e.g. 110) so as to select the memory circuit 110 for performing read operations and write operations, FIG. 2 shows the memory system 100 when performing a write operation.

Figure 2:
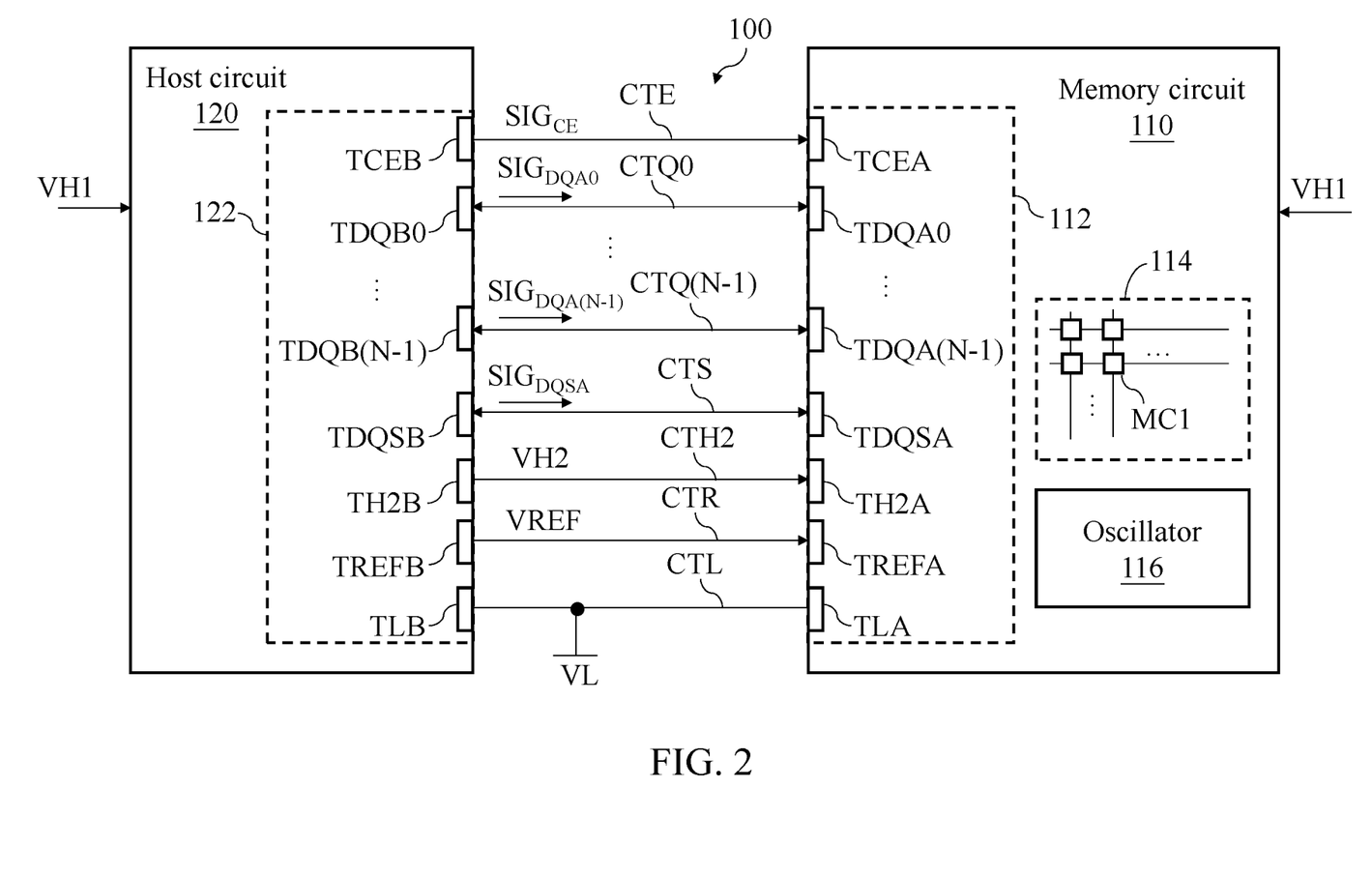
FIG. 2 shows the memory system 1 when performing a write operation.

As shown in FIG. 2, the second chip enable terminal TCEB of the host circuit 120 may transmit a chip enable signal $SIG_{CE}$ to the memory circuit 110, and the first chip enable terminal TCEA of memory circuit 110 may receive the chip enable signal $SIG_{CE}$ through the first interconnect CTE. In some embodiments, the voltage level of the chip enable signal SIG CE may be controlled to vary between a first high voltage VH1 and a low voltage VL, and the memory circuit 110 may be enabled when the received chip enable signal STG CE has a specific waveform or at a specific voltage. For example, the memory circuit 110 may be enabled when the chip enable signal $SIG_{CE}$ is transited from the first high voltage VH1 to the low voltage VL. In some embodiments, the first high voltage VH1 may be a supply voltage of the memory system 100 while the low voltage VL may be a ground voltage of the memory system 100. In the present embodiment, the first interface 112 of the memory circuit 110 may further comprise a voltage terminal TLA and the second interface 122 of the host circuit 120 may further comprise a voltage terminal TLB. The voltage terminal TLA may be coupled to the voltage terminal TLB through an interconnect CTL so the voltage terminals TLA and the TLB may be coupled to the ground for receiving the same low voltage VL.

Furthermore, the host circuit 120 may generate N first data signals $SIG_{DQA0}$ to $SIG_{DQA(N-1)}$ according to the information to be sent to the memory circuit 110. As shown in FIG. 2, the second data terminals TDQB0 to TDQB(N−1) of the host circuit 120 may transmit the first data signals $SIG_{DQA0}$ to $SIG_{DQA(N-1)}$ to the memory circuit 110, and the first data terminals TDQA0 to TDQA(N−1) of the memory circuit 110 may receive the first data signals $SIG_{DQA0}$ to $SIG_{DQA(N-1)}$ through the interconnects CTQ0 to CTQ(N−1). In the present embodiment, the voltage level of each of the first data signals $SIG_{DQA0}$ to $SIG_{DQA(N-1)}$ may vary between a second high voltage VH2 and the low voltage VL for indicating the corresponding bit values.

In some embodiments, to reduce the power consumption for generating the first data signals $SIG_{DQA0}$ to $SIG_{DQA(N-1)}$, the second high voltage VH2 may be lower than the first high voltage VH1. In the present embodiment, the host circuit 120 may generate the second high voltage VH2 based on the first high voltage VH1. As shown in FIG. 2, a voltage terminal TH2B of the second interface 122 may transmit the second high voltage VH2 to the memory circuit 110, and a voltage terminal TH2A of the first interface 112 may receive the second high voltage VH2 through the interconnect CTH2 coupling between the voltage terminals TH2A and TH2B.

Since the second high voltage VH2 can be rather small, it becomes difficult to identify the bit values according to the voltages of the first data signals $SIG_{DQA0}$ to $SIG_{DQA(N-1)}$. Therefore, in the present embodiment, the host circuit 120 may further generate a reference voltage VREF, which is higher than the low voltage VL and lower than the second high voltage VH2, for assisting the memory circuit 110 to determine values of the received bits. In the present embodiment, a difference between the second high voltage VH2 and the low voltage VL may be two times a difference between the reference voltage VREF and the low voltage VL. In such case, the memory circuit 110 may identify the values of the bits by comparing voltages of the first data signals $SIG_{DQA0}$ to $SIG_{DQA(N-1)}$ to the reference voltage VREF. For example, a bit of the first data signal $SIG_{DQA0}$ may be determined to have a logic value "1" if the voltage of the first data signal $SIG_{DQA0}$ is higher than the reference voltage VREF. Also, a bit of the first data signal $SIG_{DQA0}$ would be determined to have a logic value "0" if the voltage of the first data signal $SIG_{DQA0}$ is less than the reference voltage VREF. By utilizing the reference voltage VREF, the memory circuit 110 may identify the bit values of the first data signals $SIG_{DQA0}$ to $SIG_{DQA(N-1)}$ more quickly and more accurately.

In the present embodiment, the host circuit 120 may generate the reference voltage VREF by dividing the second high voltage VH2 in half. As shown in FIG. 2, a voltage terminal TREFB of the second interface 122 may transmit the reference voltage VREF to the memory circuit 110, and a voltage terminal TREFA of the first interface 112 may receive the reference voltage VREF through the interconnect CTR coupling between the voltage terminals TREFA and TREFB.

Moreover, to assist the memory circuit 110 to distinguish each individual bits carried by the first data signals $SIG_{DQA0}$ to $SIG_{DQA(N-1)}$, the host circuit 120 may further generate a first data strobe signal $SIG_{DQSA}$ accompanying the first data signals $SIG_{DQA0}$ to $SIG_{DQA(N-1)}$ to the memory circuit 110. As shown in FIG. 2, the second data strobe terminal TDQSB of the host circuit 120 may transmit the first data strobe signal $SIG_{DQSA}$ to the memory circuit 110, and the first data strobe terminal TDQSA of the memory circuit 110 may receive the first data strobe signal $SIG_{DQSA}$ through the third interconnect CTS. In the present embodiment, the first data strobe signal $SIG_{DQSA}$ may periodically vary between the second high voltage VH2 and the low voltage VL for a specific time interval (e.g. PW1 and PW2 in FIG. 3), and may be synchronized with the first data signals $SIG_{DQA0}$ to $SIG_{DQA(N-1)}$ for the specific time interval so that the first data strobe signal $SIG_{DQSA}$ may be arranged to latch and sample the first data signals $SIG_{DQA0}$ to $SIG_{DQA(N-1)}$.

Figure 3:
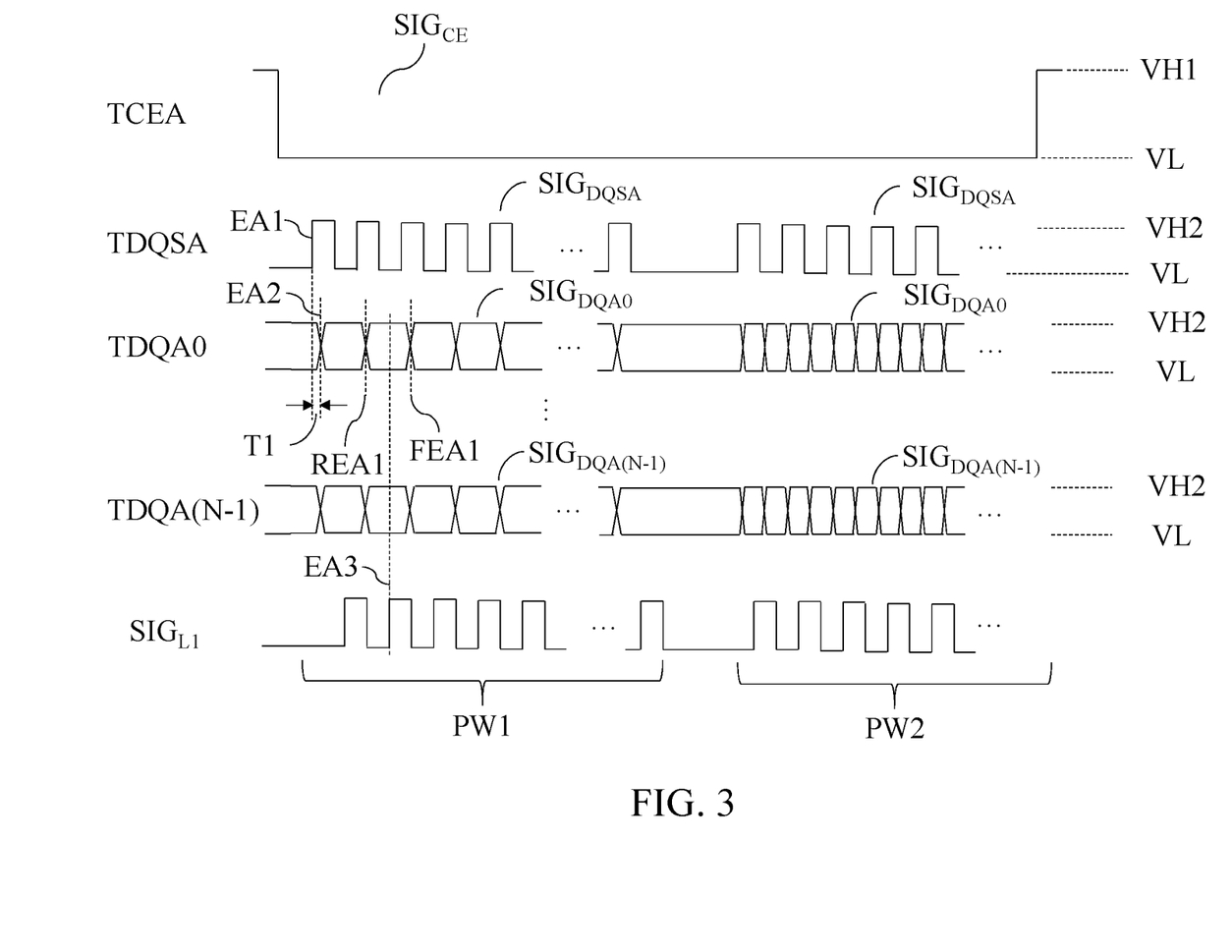
FIG. 3 shows a timing diagram of the signals transmitted between the memory circuit and the host circuit during the write operation.

FIG. 3 shows a timing diagram of the signals transmitted between the memory circuit 110 and the host circuit 120 during the write operation. As shown in FIG. 3, the write operation may be performed with two phases: a command phase PW1 and a data phase PW2. During the command phase PW1, the first data signals $SIG_{DQA0}$ to $SIG_{DQA(N-1)}$ that correspond to or carry a write command and a write address are transmitted. Since the write command and the write address are usually represented by a predetermined format and thus have fixed data lengths, the write command and the write address may be transferred to the first data terminals TDQA0 to TDQA(N-1) in a predetermined number of clock cycles of the first data strobe signal $SIG_{DQSA}$ during the command phase PW1.

In the present embodiment, during the command phase PW1, each of the first data signals $SIG_{DQA0}$ to $SIG_{DQA(N-1)}$ may be transmitted in a single data rate (SDR). That is, for each clock cycle of the first data strobe signal $SIG_{DQSA}$ during the command phase PW1, each of the first data signals $SIG_{DQA0}$ to $SIG_{DQA(N-1)}$ will only vary its voltage once at most. As a result, for each clock cycle of the first data strobe signal $SIG_{DQSA}$, the memory circuit 110 may identify one single data from each of the first data signals $SIG_{DQA0}$ to $SIG_{DQA(N-1)}$. In the present embodiment, the single data rate scheme adopted in the command phase PW1 provides a wider latching window for the memory circuit 110 to sample the first data signals $SIG_{DQA0}$ to $SIG_{DQA(N-1)}$.

Figure 4:
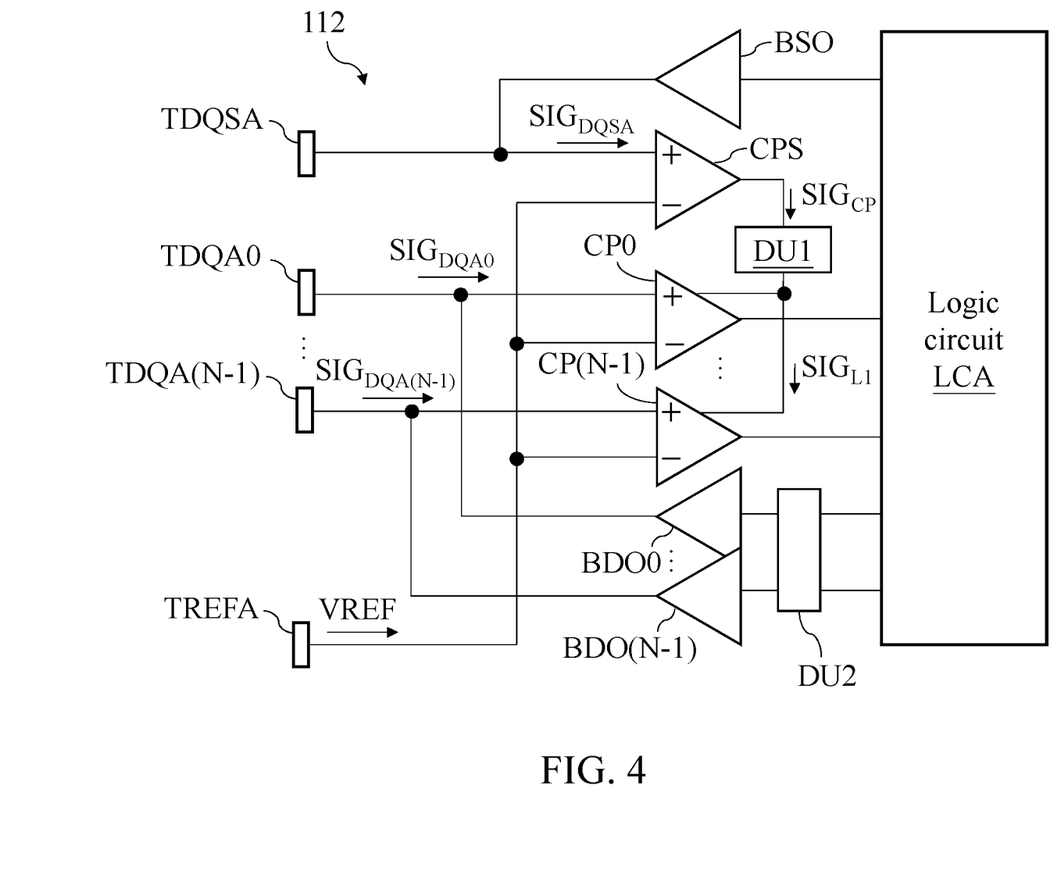
FIG. 4 shows a schematic of parts of the first interface when performing the write operation.

As shown in FIG. 3, a signal edge EA1 of the first data strobe signal $SIG_{DQSA}$ is leading a signal edge EA2 of the first data signals $SIG_{DQA0}$ to $SIG_{DQA(N-1)}$ by a first time interval T1, and a latching signal $SIG_{L1}$ may be derived from the first data strobe signal $SIG_{DQSA}$ for sampling the first data signals $SIG_{DQA0}$ to $SIG_{DQA(N-1)}$. In some embodiments, the latching signal $SIG_{L1}$ may be generated by utilizing a delay component in the interface 112. FIG. 4 shows a schematic of parts of the first interface 112 when performing the write operation.

As shown in FIG. 4, the first interface 112 may comprise a logic circuit LCA, an input strobe comparator CPS, a delay unit DUE, and N input data comparators CP0 to CP(N-1). The input strobe comparator CPS is coupled to the first data strobe terminal TDQSA for receiving the first data strobe signal $SIG_{DQSA}$, and the input data comparators CP0 to CP(N-1) are coupled to the first data terminals TDQA0 to TDQA(N-1) for receiving the first data signals $SIG_{DQA0}$ to $SIG_{DQA(N-1)}$ respectively and correspondingly. The input strobe comparator CPS may compare the first data strobe signal $SIG_{DQSA}$ to the reference voltage VREF and output a comparing signal $SIG_{CP}$ to the delay unit DU1. The delay unit DU1 may thus generate the latching signal $SIG_{L1}$ by delaying the comparing signal $SIG_{CP}$ for a predetermined time. As a result, the input data comparators CP0 to CP(N-1) may be triggered by the latching signal $SIG_{L1}$ to compare the first data signals $SIG_{DQA0}$ to $SIG_{DQA(N-1)}$ to the reference voltage VREF so that the logic circuit LCA may further identify the bit values of the first data signals $SIG_{DQA0}$ to $SIG_{DQA(N-1)}$ accordingly.

In the present embodiment, by adjusting the delay time provided by the delay unit DU1 appropriately, a signal edge EA3 of the latching signal $SIG_{L1}$ may be aligned to a window region between a rising edge REA1 and a falling edge FEA1 of the first data signals $SIG_{DQA0}$ to $SIG_{DQA(N-1)}$, thereby allowing the input data comparators CP0 to CP(N-1) to sample the first data signals $SIG_{DQA0}$ to $SIG_{DQA(N-1)}$ when the first data signals $SIG_{DQA0}$ to $SIG_{DQA(N-1)}$ are at the desired voltages stably.

Furthermore, in the present embodiment, since the host circuit 120 attempts to control the memory circuit 110 to perform the write operation, the host circuit 120 would start to generate first data signals $SIG_{DQA0}$ to $SIG_{DQA(N-1)}$ that correspond to a write data to be written into the memory circuit 110 after the first data signals $SIG_{DQA0}$ to $SIG_{DQA(N-1)}$ that correspond to the write command and the write address are transmitted in the command phase PW1. As shown in FIG. 3, the first data signals $SIG_{DQA0}$ to $SIG_{DQA(N-1)}$ corresponding to the write data may be transmitted along with the first data strobe signal $SIG_{DQSA}$ during the data phase PW2 after the command phase PW1. That is, during the data phase PW2, the data terminals TDQA0 to TDQA(N−1) receives the first data signals $SIG_{DQA0}$ to $SIG_{DQA(N-1)}$ while the data strobe terminal TDQSA receives the first data strobe signal $SIG_{DQSA}$.

In addition, during the data phase PW2, the first data signals $SIG_{DQA0}$ to $SIG_{DQA(N-1)}$ corresponding to the write data may be transmitted in a double data rate (DDR). That is, for each clock cycle of the first data strobe signal $SIG_{DQSA}$ during the data phase PW2, each of the first data signals $SIG_{DQA0}$ to $SIG_{DQA(N-1)}$ may vary its voltage twice at most. As a result, for each clock cycle of the first data strobe signal $SIG_{DQSA}$, the memory circuit 110 may identify two bits of data from each of the first data signals $SIG_{DQA0}$ to $SIG_{DQA(N-1)}$ during the data phase PW2.

In the present embodiment, since the first data signals $SIG_{DQA0}$ to $SIG_{DQA(N-1)}$ and the first data strobe signal $SIG_{DQSA}$ may swing frequently. i.e., may comprise high-speed voltage swings, the second high voltage VH2 is intentionally configured to be as small as possible so as to reduce the overall power consumption of the memory system 100, in particular the power consumption of the host circuit 120. Also, an electromagnetic interference (EMI) issue caused by the high-speed voltage swings may be mitigated by lowering the level of the second high voltage VH2 as well.

Moreover, to further reduce the power consumption and mitigate the EMI issue, the first data strobe signal $SIG_{DQSA}$ may stop swinging when the first data signals $SIG_{DQA0}$ to $SIG_{DQA(N-1)}$ stop transmitting. For example, before and after the write operation, the first data strobe signal $SIG_{DQSA}$ may remain at the low voltage VL as shown in FIG. 3. Additionally, in some embodiments, during a transition between the command phase PW1 and the data phase PW2, the first data strobe signal $SIG_{DQSA}$ may also stop swinging if no valid bits are transmitted through the first data signals $SIG_{DQA0}$ to $SIG_{DQA(N-1)}$ during the transition period. Consequently, the EMI issue can be further mitigated.

However, to detect such small voltage swing may require dedicated components in the memory circuit 110, and thus may require higher power. In the present embodiment, to reduce unnecessary power consumption of the memory circuit 110, the voltage swing of the chip enable signal $SIG_{CE}$ may be larger so that the memory circuit 110 can detect the enabling condition without using low-voltage detection components, and the memory circuit 110 may detect and process the first data signals $SIG_{DQA0}$ to $SIG_{DQA(N-1)}$ only when the memory circuit 110 is enabled. Since the chip enable signal $SIG_{CE}$ will remain at the same voltage, for example, the low voltage VL, during the entire operation to keep the memory circuit 110 enabled, the swing frequency of the chip enable signal $SIG_{CE}$ is rather low. Therefore, the power consumption of the host circuit 120 and the EMI issue caused by the chip enable signal $SIG_{CE}$ of a higher voltage swing are rather acceptable.

Consequently, in the present embodiment, the first high voltage VH1 is higher than the second high voltage VH2 to allow the memory circuit 110 to detect the chip enable signal $SIG_{CE}$ easily, and the second high voltage VH2 may be higher than the low voltage VL. In some embodiments, the first high voltage VH1 may be higher than 0.8V and the second high voltage VH2 may be less than 0.6V. For example, the first high voltage VH1 may be 1.8V and the second high voltage VH2 may be 0.3V, but the disclosure is not limited thereto.

Figure 5:
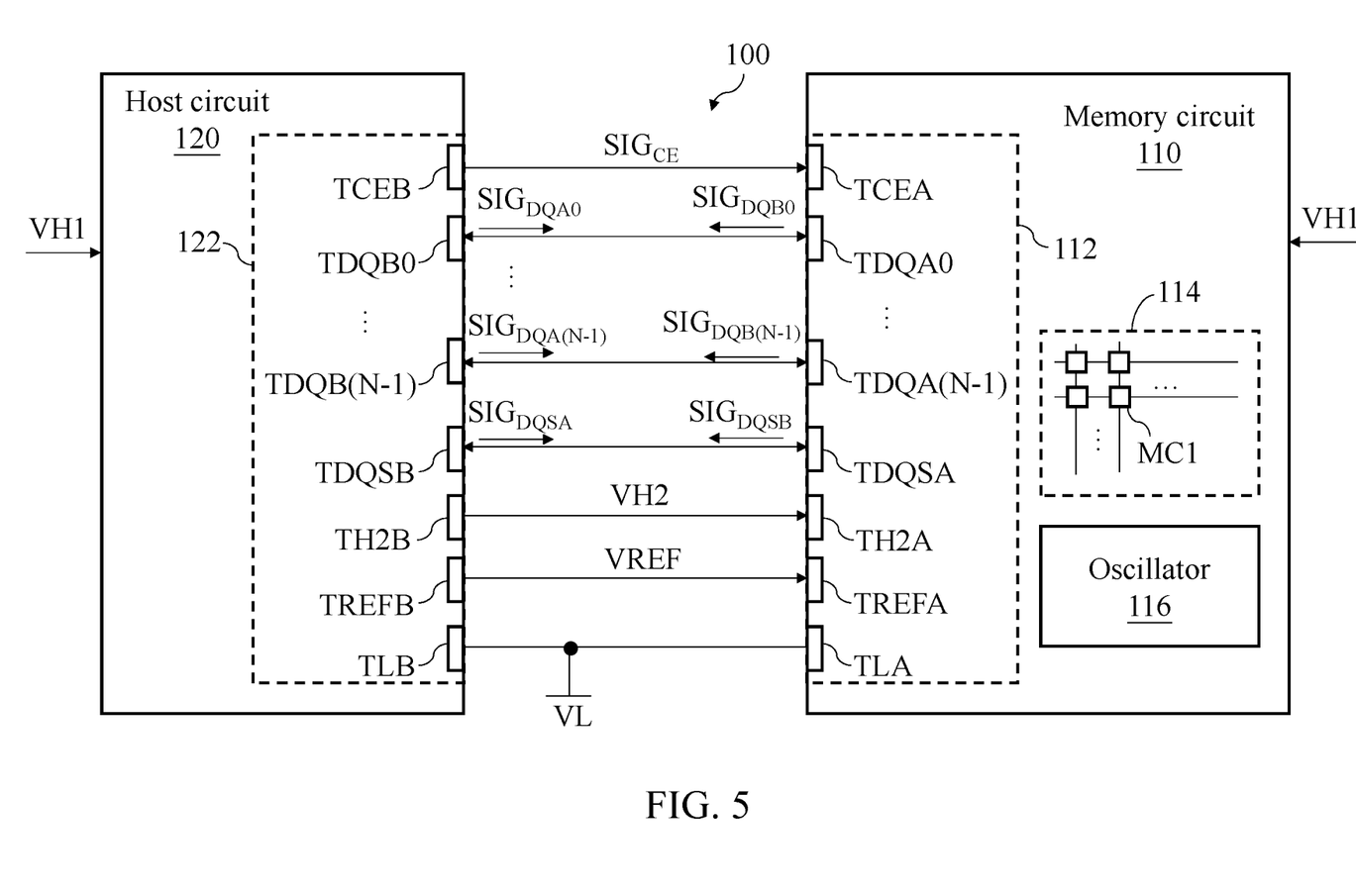
FIG. 5 shows the memory system in FIG. 1 when performing a read operation.
Figure 6:
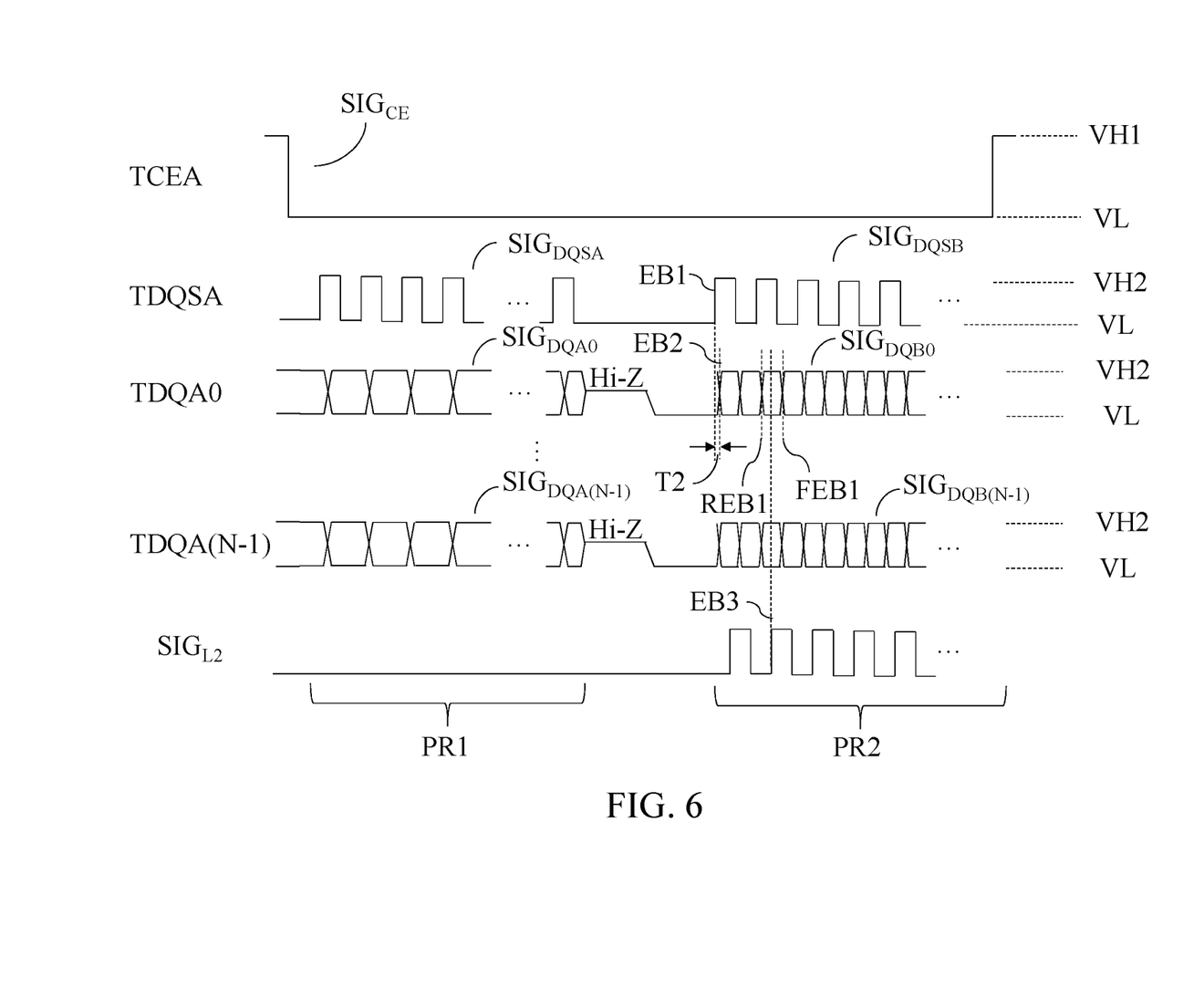
FIG. 6 shows a timing diagram of signals transmitted between the memory circuit and the host circuit during the read operation.

FIG. 5 shows the memory system 100 when performing a read operation. FIG. 6 shows a timing diagram of signals transmitted between the memory circuit 110 and the host circuit 120 during the read operation. As shown in FIG. 6, the read operation comprises a command phase PR1 and a data phase PR2. During the command phase PR1, the first data signals $SIG_{DQA0}$ to $SIG_{DQA(N-1)}$ are corresponding to or carrying a read command and a read address and may be transmitted in the single data rate. After the first data signals $SIG_{DQA0}$ to $SIG_{DQA(N-1)}$ are transmitted, the host circuit 120 would hand over the channel between the data strobe terminals TDQSA and TDQSB and the channels between the data terminals TDQA0 to TDQA(N−1) and TDQB0 to TDQB(N−1) to the memory circuit 110 so that the memory circuit 110 can transmit the read data to the host circuit 120 accordingly. Moreover, during the command phase PR1, when the first data signals $SIG_{DQA0}$ to $SIG_{DQA(N-1)}$, are transmitted, the host circuit 120 may control the first data terminals TDQA0 to TDQA(N−1) to remain at high impedance state (i.e. the Hi-Z in FIG. 6) for a predetermined time such that the memory circuit 110 may have enough time to take over the channels. When the host circuit 120 is ready to sample the signals transmitted from the memory circuit 110, the voltage levels at the first data terminals TDQA0 to TDQA(N−1) may be transited to a predetermined voltage level (e.g. the low voltage VL) as shown in FIG. 6. In some embodiments, during the hand over time, the host circuit 120 may keep the data strobe terminals TDQSA and TDQSB at the low voltage VL so as to prevent glitches before the memory circuit 110 takes over.

In the present embodiment, after the memory circuit 110 reads the first data signals $SIG_{DQA0}$ to $SIG_{DQA(N-1)}$, the memory circuit 110 may generate second data signals $SIG_{DQB0}$ to $SIG_{DQB(N-1)}$ corresponding to data stored in a memory cell of the memory array 114 according to the read address. Afterwards, the first data terminals TDQA0 to TDQA(N−1) of the memory circuit 110 may transmit the second data signals $SIG_{DQB0}$ to $SIG_{DQB(N-1)}$ to the second data terminals TDQB0 to TDQB(N−1) of the host circuit 120.

Furthermore, to assist the host circuit 120 to distinguish each bits of the second data signals $SIG_{DQB0}$ to $SIG_{DQB(N-1)}$, the memory circuit 110 may transmit the second data strobe signal $SIG_{DQSB}$ through the first data strobe terminal TDQSA along with the second data signals $SIG_{DQB0}$ to $SIG_{DQB(N-1)}$. The second data strobe signal $SIG_{DQSB}$ is synchronized with the second data signals $SIG_{DQB0}$ to $SIG_{DQB(N-1)}$ so that the host circuit 120 can latch and sample the second data signals $SIG_{DQB0}$ to $SIG_{DQB(N-1)}$ according to the second data strobe signal $SIG_{DQSB}$. In the present embodiment, as shown in FIG. 5, the memory circuit 110 may further comprise an oscillator 116, such as a ring oscillator, for generating the second data strobe signal $SIG_{DQSB}$.

Figure 7:
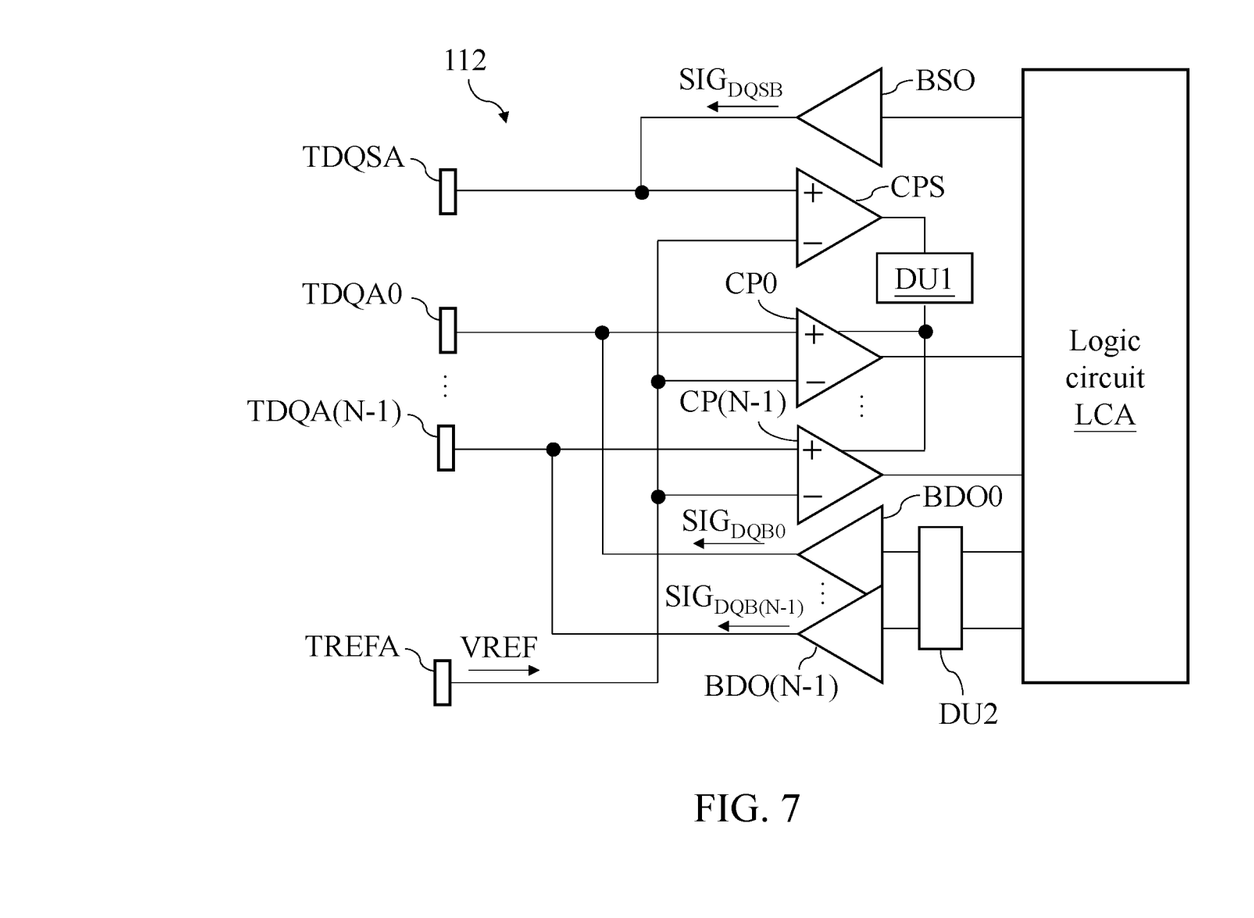
FIG. 7 shows the schematic of parts of the st interface when performing the read operation.

As shown in FIG. 6, a signal edge EB1 of the second data strobe signal $SIG_{DQSB}$ is leading a signal edge EB2 of the second data signals $SIG_{DQB0}$ to $SIG_{DQB(N-1)}$ by a second time interval T2. In addition, a latching signal $SIG_{L2}$ may be derived from the second data strobe signal $SIG_{DQSB}$ for sampling the second data signals $SIG_{DQB0}$ to $SIG_{DQB(N-1)}$. FIG. 7 shows the schematic of parts of the first interface 112 when performing the read operation.

As shown in FIG. 7, in addition to the logic circuit LCA, the input strobe comparator CPS, the delay unit DU1, and the input data comparators CP0 to CP(N−1) introduced in the FIG. 4, the first interface 112 further comprise an output strobe buffer BSO, a delay unit DU2, and N output data buffer BDO0 to BDO(N−1). The output strobe buffer BSO is coupled to the first data strobe terminal TDQSA for transmitting the second data strobe signal $SIG_{DQSB}$, and the output data buffers BDO0 to BDO(N−1) are coupled to the first data terminals TDQA0 to TDQA(N−1) for transmitting the second data signals $SIG_{DQB(N-1)}$ to $SIG_{DQB(N-1)}$ respectively and correspondingly. In such case, the logic circuit LCA may output the second data signals $SIG_{DQB0}$ to $SIG_{DQB(N-1)}$ to the delay unit DU2, and the delay unit DU2 may delay the second data signals $SIG_{DQB0}$ to $SIG_{DQB(N-1)}$ for a predetermined time according to the second data strobe signal $SIG_{DQSB}$, ensuring that the signal edge EB1 of the second data strobe signal $SIG_{DQSB}$ can lead the signal edges EB2 of the second data signals $SIG_{DQB0}$ to $SIG_{DQB(N-1)}$.

In some embodiments, the second interface 122 of the host circuit 120 and the first interface 112 of the memory circuit 110 may have symmetrical structures. In such case, the second interface 122 may derive the latching signal $SIG_{L2}$ from the second data strobe signal $SIG_{DQSB}$ that has a signal edge EB3 aligned to a window region between a rising edge REB2 and a falling edge FEB2 of the second data signals $SIG_{DQB0}$ to $SIG_{DQB(N-1)}$ as shown in FIG. 6. As a result, the host circuit 120 can utilize the latching signal $SIG_{L2}$ to latch and sample the second data signals $SIG_{DQA0}$ to $SIG_{DQB(N-1)}$ when second data signals $SIG_{DQA0}$ to $SIG_{DQB(N-1)}$ are at the desired voltages stably.

Furthermore, as shown in FIG. 6, during the data phase PR2, the second data signals $SIG_{DQB0}$ to $SIG_{DQB(N-1)}$ corresponding to the read data may be transmitted in the double data rate. That is, for each clock cycle of the second data strobe signal $SIG_{DQSB}$ during the data phase PR2, each of the second data signals $SIG_{DQB0}$ to $SIG_{DQB(N-1)}$ may vary its voltage twice at most. As a result, for each clock cycle of the second data strobe signal $SIG_{DQSB}$, the memory circuit 110 can transmit two bits of data by each of the second data signals $SIG_{DQB0}$ to $SIG_{DQB(N-1)}$ during the data phase PR2.

In addition, as shown in FIG. 6, since the second data strobe signal $SIG_{DQSB}$ and the second data signals $SIG_{DQB0}$ to $SIG_{DQB(N-1)}$ are varied between the second high voltage VH2 and the low voltage VL, the second data strobe signal $SIG_{DQSB}$ and the second data signals $SIG_{DQB0}$ to $SIG_{DQB(N-1)}$ can have small voltage swings. As a result, the power consumption of the memory circuit 110 can be reduced and the EMI issue caused by the high-speed voltage swing can be mitigated.

Although in the memory system 100, the second high voltage VH2 and the reference voltage VREF are generated by the host circuit 120, the present disclosure is not limited thereto. In some other embodiments, the memory circuit 110 may generate the second high voltage VH2 and the reference voltage VREF, and may transmit the second high voltage VH2 and the reference voltage VREF to the host circuit 120.

Figure 8:
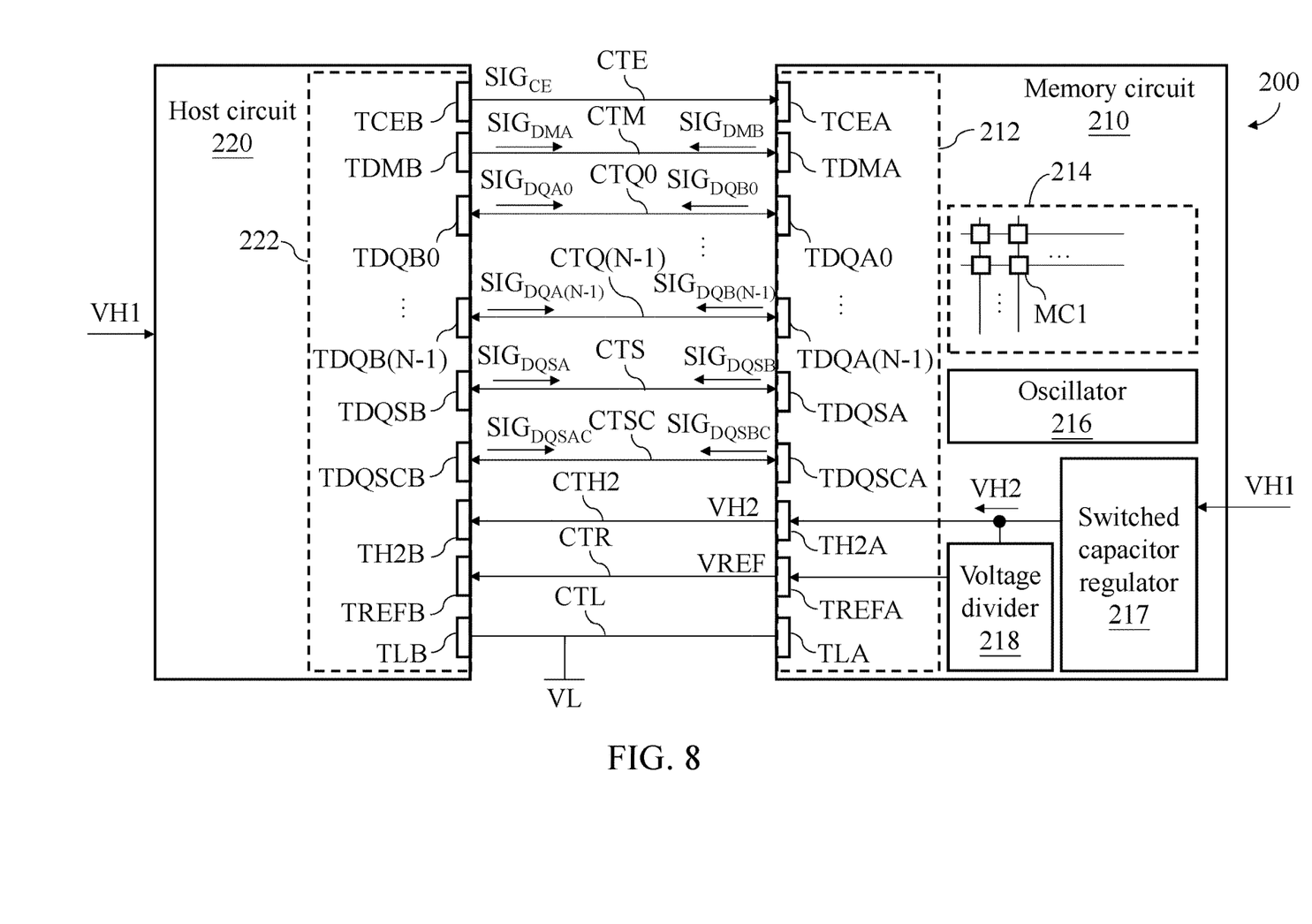
FIG. 8 shows a memory system according to another embodiment of the present disclosure.

FIG. 8 shows a memory system 200 according to another embodiment of the present disclosure. The memory system 200 and the memory system 100 have similar structures and may be operated according to similar principles. However, the memory circuit 210 may generate the second high voltage VH2 and the reference voltage VREF internally according to the first high voltage VH1, and transmit the second high voltage VH2 and the reference voltage VREF to the host circuit 220.

As shown in FIG. 8, the memory circuit 210 may further comprise a switched capacitor regulator 217 for generating the second high voltage VH2 according to the first high voltage VH1 supplied externally. In some embodiments, the memory array 214 may be comprised of a plurality of DRAM cells MC1 and is fabricated by a manufacturing process capable of forming high-quality and high-density capacitors required by the DRAM cells MC1. In such case, the switched capacitor regulator 217 may be manufactured in the same process as that used to form the DRAM cells MC1, so the switched capacitor regulator 217 can have better power efficiency due to higher quality of the capacitors. Also, the reference voltage VREF may be generated according to the second high voltage VH2 using a voltage divider 218. That is, the voltage terminals TH2A and TREFA of the first interface 212 may transmit the second high voltage VH2 and the reference voltage VREF to the host circuit 220.

Furthermore, the host circuit 220 may generate a first complementary data strobe signal $SIG_{DQSAC}$ that is complementary to the first data strobe signal $SIG_{DQSA}$. Since the voltage swing of the first data strobe signal $SIG_{DQSA}$ is rather small, the data strobe signals $SIG_{DQSA}$ and $SIG_{DQSAC}$ that are complementary to each other can be sensed as a differential pair so as to increase the overall voltage swing sensed by the memory circuit 210. In some embodiments, instead of comparing the first data strobe signal $SIG_{DQSA}$ to the reference voltage VREF as shown in FIG. 4 and FIG. 7, an input strobe comparator of the memory circuit 210 may compare the first data strobe signal $SIG_{DQSA}$ to the first complementary data strobe signal $SIG_{DQSAC}$ to derive a latching signal for latching and sampling the first data signals $SIG_{DQA0}$ to $SIG_{DQA(N-1)}$. Similarly, the memory circuit 210 may also generate and transmit the second data strobe signal $SIG_{QSB}$ and the a second complementary data strobe signal $SIG_{DQSBC}$ when transmitting the second data signals $SIG_{DQB0}$ to $SIG_{DQB(N-1)}$, thereby assisting the host circuit 220 to derive the latching signal for latching and sampling the second data signals $SIG_{DQB0}$ to $SIG_{DQB(N-1)}$ accordingly.

As shown in FIG. 8, the first interface 212 of the memory circuit 210 may further comprise a first complementary data strobe terminal TDQSCA, and the second interface 222 of the host circuit 220 may further comprise a second complementary data strobe terminal TDQSCB coupled to the first complementary data strobe terminal TDQSCA through an interconnect CTSC. In such case, the first complementary data strobe terminal TDQSCA may receive the first complementary data strobe signal $SIG_{DQSAC}$ and transmit the second complementary data strobe signal $SIG_{DQSBC}$. Also the second complementary data strobe terminal TDQSCB may transmit the first complementary data strobe signal $SIG_{DQSAC}$ and receive the second complementary data strobe signal $SIG_{DQSBC}$.

Furthermore, in some embodiments, a data mask may be adopted when performing a burst read operation or a burst write operation since the burst read operation and the burst write operation may have a fixed data length, and dummy bits may be added for meeting such requirement. Therefore, the data mask may be used to indicate valid bits so the receiver can ignore the dummy bits.

As shown in FIG. 8, the first interface 212 of the memory circuit 210 may further comprise a voltage terminal TDMA, and the second interface 222 of the host circuit 220 may further comprise a voltage terminal TDMB coupled to the voltage terminal TDMA through an interconnect CTM. The host circuit 220 may generate a first data mask signal $SIG_{DMA}$ and transmit the first data mask signal $SIG_{DMA}$ through the voltage terminal TDMB, and the voltage terminal TDMA may receive the first data mask signal $SIG_{DMA}$. In such case, the memory circuit 210 may retrieve valid bits from bits of the first data signals $SIG_{DQA0}$ to $SIG_{DQA(N-1)}$ according to the first data mask signal $SIG_{DMA}$ when reading the first data signals $SIG_{DQA0}$ to $SIG_{DQA(N-1)}$. Similarly, the memory circuit 210 may also generate and transmit a second data mask signal $SIG_{DMB}$ through the voltage terminal TDMA for indicating valid bits in the second data signals $SIG_{DQB0}$ to $SIG_{DQB(N-1)}$.

In summary, the memory system and the interfaces of the memory circuits provided by the embodiments of the present disclosure can be operated with signals of low voltage swing; therefore, the power consumption related to controlling an external memory can be significantly reduced and the corresponding EMI issue can be mitigated. Furthermore, since the host circuit and the memory circuit can be manufactured in different dies according to different manufacturing processes, the yield rate of the memory system can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. An interface of a memory circuit comprising:
a chip enable terminal configured to receive a chip enable signal that varies between a first high voltage and a low voltage for enabling the memory circuit;
at least one data terminal configured to receive at least one first data terminal signal that varies between a second high voltage and the low voltage during a command phase, and to transmit or receive at least one second data terminal signal during a data phase; and
a data strobe terminal configured to receive a first data strobe signal that periodically varies between the second high voltage and the low voltage during the command phase, and to transmit or receive a second data strobe signal that swings periodically between two different voltages during the data phase;
wherein during a transition interval between the command phase and the data phase, the data strobe terminal stops receiving or transmitting data strobe signals that swing periodically between the two different voltages.

2. The interface of claim 1, wherein the first data strobe signal is synchronized with the at least one first data terminal signal, the first data strobe signal is arranged to latch and sample the at least one first data terminal signal.

3. The interface of claim 1, wherein during the transition interval, the at least one data terminal stops receiving or transmitting data terminal signals.

4. The interface of claim 1, wherein the first high voltage is higher than the second high voltage, and the second high voltage is higher than the low voltage.

5. The interface of claim 4, wherein:
the memory circuit further comprises a plurality of dynamic random-access memory (DRAM) cells and a switched capacitor regulator configured to generate the second high voltage according to the first high voltage.

6. The interface of claim 4, wherein:
the memory circuit is further configured to provide the second high voltage and a reference voltage;
a difference between the second high voltage and the low voltage is two times a difference between the reference voltage and the low voltage; and
a bit value of the at least one first data terminal signal is identified by comparing voltages of the at least one first data terminal signal and the reference voltage.

7. The interface of claim 1, wherein a data rate of the at least one first data terminal signal is a single data rate (SDR) that transfers a single data for each clock cycle of the first data strobe signal during the command phase.

8. The interface of claim 1, wherein a data rate of the at least one second data terminal signal is a double data rate (DDR) that transfers two data for each clock cycle of the second data strobe signal during the data phase.

9. The interface of claim 1, wherein when the at least one first data terminal signal corresponds to a read command and a read address during the command phase, the at least one data terminal transmits the at least one second data terminal signal corresponding to a read data read out from the memory circuit during the data phase after the command phase, and the data strobe terminal transmits the second data strobe signal during the data phase.

10. The interface of claim 1, wherein when the at least one first data terminal signal corresponds to a write command and a write address during the command phase, the at least one data terminal receives the at least one second data terminal signal corresponding to a write data to be written into the memory circuit during the data phase after the command phase, and the data strobe terminal receives the second data strobe signal during the data phase.

11. An interface of a memory circuit comprising:
at least one data terminal configured to receive at least one first data terminal signal during a command phase, and to transmit or receive at least one second data terminal signal during a data phase; and
a data strobe terminal configured to receive a first data strobe signal that swings periodically between two different voltages during the command phase, and to transmit or receive a second data strobe signal that swings periodically between the two different voltages during the data phase;
wherein the first data strobe signal is synchronized with the at least one first data terminal signal, the first data strobe signal is arranged to latch and sample the at least one first data terminal signal, and during a transition interval between the command phase and the data phase, the data strobe terminal stops receiving or transmitting data strobe signals that swing periodically.

12. The interface of claim 11, wherein during the transition interval, the at least one data terminal stops receiving or transmitting data terminal signals.

13. The interface of claim 11, further comprising a chip enable terminal configured to receive a chip enable signal that varies between a first high voltage and a low voltage for enabling the memory circuit, wherein the first data terminal signal varies between a second high voltage and the low voltage and the first data strobe signal varies between the second high voltage and the low voltage during the command phase and the data phase.

14. The interface of claim 13, wherein the first high voltage is higher than the second high voltage, and the second high voltage is higher than the low voltage.

15. The interface of claim 14, wherein:
the memory circuit further comprises a plurality of dynamic random-access memory (DRAM) cells and a switched capacitor regulator configured to generate the second high voltage according to the first high voltage.

16. The interface of claim 14, wherein:
the memory circuit is further configured to provide the second high voltage and a reference voltage;
a difference between the second high voltage and the low voltage is two times a difference between the reference voltage and the low voltage; and
a bit value of the at least one first data terminal signal is identified by comparing voltages of the at least one first data terminal signal and the reference voltage.

17. The interface of claim 11, wherein a data rate of the at least one first data terminal signal is a single data rate (SDR) that transfers a single data for each clock cycle of the first data strobe signal during the command phase.

18. The interface of claim 11, wherein a data rate of the at least one second data terminal signal is a double data rate (DDR) that transfers two data for each clock cycle of the second data strobe signal during the data phase.

19. The interface of claim 11, wherein when the at least one first data terminal signal corresponds to a read command and a read address during the command phase, the at least one data terminal transmits the at least one second data terminal signal corresponding to a read data read out from the memory circuit during the data phase after the command phase, and the data strobe terminal transmits the second data strobe signal during the data phase.

20. The interface of claim 11, wherein when the at least one first data terminal signal corresponds to a write command and a write address during the command phase, the at least one data terminal receives the at least one second data terminal signal corresponding to a write data to be written into the memory circuit during the data phase after the command phase, and the data strobe terminal receives the second data strobe signal during the data phase.

* * * * *